United States Patent [19]
Hill

[11] Patent Number: 5,920,234
[45] Date of Patent: Jul. 6, 1999

[54] BUFFERED OSCILLATOR TRANSMITTER ARRANGEMENT FOR POWER SPECIFIC APPLICATIONS HAVING PARASITIC IMPEDANCES

[75] Inventor: John P. Hill, Westland, Mich.

[73] Assignee: UT Automotive Dearborn, Inc., Dearborn, Mich.

[21] Appl. No.: 09/104,453

[22] Filed: Jun. 24, 1998

Related U.S. Application Data

[60] Division of application No. 08/847,237, May 1, 1997, Pat. No. 5,859,572, which is a continuation-in-part of application No. 08/633,280, Apr. 16, 1996, Pat. No. 5,699,021, which is a division of application No. 08/448,759, May 24, 1995, Pat. No. 5,568,095.

[51] Int. Cl.$^6$ ............................... H03B 5/36; H04L 27/04
[52] U.S. Cl. ..................... 331/75; 331/77; 331/107 A; 340/825.69; 375/296; 455/129
[58] Field of Search ................... 331/74, 75, 77, 331/107 A; 340/825.69; 375/296; 455/129

[56] References Cited

U.S. PATENT DOCUMENTS 3,609,728  9/1971  Quinn et al. ...................... 340/870.17
3,643,162  2/1972  Ady .................................. 331/106

FOREIGN PATENT DOCUMENTS

WO96/16473  5/1996  WIPO .

Primary Examiner—Siegfried H. Grimm
Attorney, Agent, or Firm—Ozer M. N. Teitelbaum

[57] ABSTRACT

A transmitter circuit includes an output impedance and a buffered oscillator. The buffered oscillator includes a resonator for generating a reference signal and an amplifier coupled with the resonator for amplifying the reference signal. A first resonant tank generates an oscillating output signal in response to the amplified reference signal. A buffer circuit buffers the oscillating output signal and lowers the output impedance.

14 Claims, 3 Drawing Sheets

BUFFERED OSCILLATOR TRANSMITTER ARRANGEMENT FOR POWER SPECIFIC APPLICATIONS HAVING PARASITIC IMPEDANCES

RELATED APPLICATIONS

This application is a divisional application of a U.S. patent application, Ser. No. 08/847,237, filed on May 1, 1997, and now U.S. Pat. No. 5,859,572, which was a continuation-in-part of Ser. No. 08/633,280, filed on Apr. 16, 1996 and now U.S. Pat. No. 5,699,021, and which was a division of Ser. No. 08/488,759, filed on May 24, 1995 and now U.S. Pat. No. 5,568,095, all of which are commonly assigned with the present invention.

FIELD OF THE INVENTION

This invention relates generally to radio frequency ("RF") transmitters and, more particularly, to a balanced oscillator and transmitter arrangement for power specific applications.

BACKGROUND OF THE INVENTION

Compact radio frequency ("RF") transmitters are widely employed in connection with remote signal communication systems. Compact transmitters are commonly used for remotely controlling automatic garage door systems, electronic sound systems, televisions and VCRs. In the automotive industry, compact transmitters are commonly used in remote keyless entry systems to provide remote control access to a vehicle, as well as controlling other vehicular functions such as alarm system features, trunk release, for example. Ideally, compact hand held transmitters are battery operated, energy efficient and intended to accommodate a compact enclosure.

In one known compact remote system design, the transmitter radiates an RF signal with a predetermined carrier frequency encoded according to an on/off switched pattern. This radiating signal is subsequently received by a remote receiver. Once received, the signal is processed, if necessary, and then provided as a control signal to control a function or feature of the system.

Currently, a number of compact remote RF transmitters employing a single oscillator system for providing a local oscillation signal are known. In light of their cost and simplicity, single oscillator circuits have been the transmitter component of choice in automotive, remote controlled, keyless entry systems.

Single oscillator systems are well suited for the RF signal transmission applications of a remote keyless entry system. However, these known single oscillator designs have several limitations regarding power output in particular applications. Traditional single oscillators, moreover, are overly sensitive to unwanted parasitic impedances created by the grasp of a user's hand on the transmitter's housing, the housing itself or the material to which the transmitter is fixedly adjoined, such as an automobile headliner or visor. This sensitivity is attributable to the additional impedance created by these parasitic effects which reduce the amount of transmitted energy towards the receiver due to the limited power available from these known single oscillator designs. In certain environments, such as those dictated by the European market, an output signal with a higher signal to noise ratio, and relatively greater power strength is required. In other applications, the remote keyless entry ("RKE") systems requirements driven by the international customer necessitate a low power design. In powering down the known balanced oscillator designs, the gain margin is reduced to the point where the small reductions in the gain of the transistors or output tank center frequency prevent the overall operation of the oscillation of the circuit. Thus, too much power would be radiated for particular markets, such as Japan, by a providing a minimally operational balanced oscillator, and in other markets, too little power would be generated by traditional means.

In view of these problems, a demand exists for an oscillator circuit for use in a transmitter having a diminished power output. A need further exists for an oscillator circuit having an increased signal to noise ratio.

SUMMARY OF THE INVENTION

The primary advantage of the present invention is to overcome the limitations of the prior art.

In order to achieve the advantages of the present invention, a transmitter system for transmitting an output signal having an output level and a signal to noise ratio is disclosed. The transmitter system comprises a balanced oscillator comprised of a resonator for generating a reference signal, and for creating a parasitic impedance. Moreover, the balanced oscillator comprises a first oscillator comprising a first amplifier for amplifying the reference signal, and a first feedback circuit for generating a first oscillating output signal in response to the amplified reference signal amplified by the first amplifier. Similarly, the balanced oscillator comprises a second oscillator comprising a second amplifier for amplifying said reference signal, and a second feedback circuit for generating a second oscillating output signal in response to the amplified reference signal amplified by the second amplifier. The transmitter system additionally comprises an antenna comprising the parasitic impedance created by the resonator for radiating the output signal corresponding with the first and second oscillating output signals to decrease the output level while increasing the signal to noise ratio.

In a further embodiment of the present invention, the transmitter system comprises a resonator interface having a lead, wire, trace or connector providing the parasitic impedance which forms the antenna for radiating the output signal.

In still another embodiment of the present invention, the transmitter system comprises a filter for phase shifting the output signal comprised of an inductor and a filter parasitic impedance.

In yet another embodiment of the present invention, a transmitter circuit for transmitting an output signal having a singular frequency is detailed. The transmitter circuit comprises an output impedance and a buffered oscillator. The buffered oscillator comprises a resonator for generating a reference signal, an amplifier coupled with the resonator for amplifying the reference signal, a first resonant tank for generating an oscillating output signal in response to the amplified reference signal, and a buffer circuit for buffering the oscillating output signal. Moreover, the transmitter circuit comprises an antenna for radiating the output signal corresponding with the oscillating output signal.

These and other advantages and objects will become apparent to those skilled in the art from the following detailed description read in conjunction with the appended claims and the drawings attached hereto.

BRIEF DESCRIPTION OF THE DRAWINGS

The present invention will be better understood from reading the following description of non-limitative embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 1:
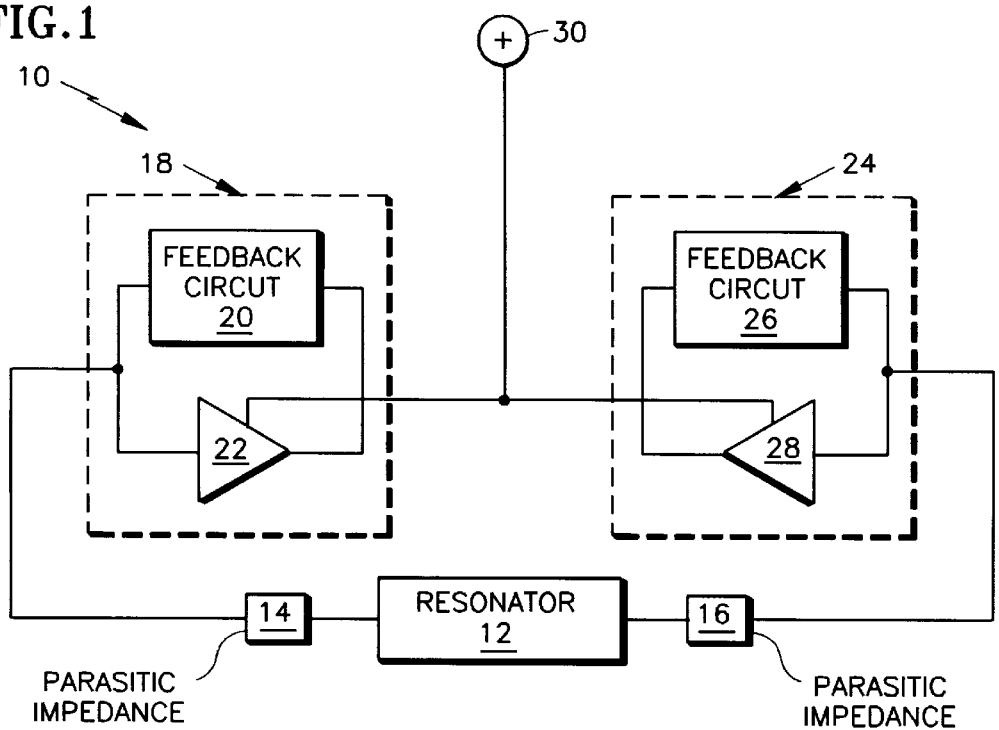
FIG. 1 illustrates a block diagram of a balanced oscillator and transmitter system according to the preferred embodiment of the present invention.

Referring FIG. 1, a block diagram of a balanced oscillator and transmitter system 10 is illustrated according to the preferred embodiment of the present invention. System 10 comprises a balanced oscillator having a resonator 12 for generating a reference signal. Preferably, resonator 12 comprises a surface acoustic wave ("SAW") device. However, in an alternate embodiment, resonator 12 is realized by a bulk acoustic wave ("BAW") device.

Further, the balanced oscillator comprises a first and a second oscillator, 18 and 24, each of which are coupled to resonator 12 by means of an interface. This interface comprises a lead, wire, trace, socket or connector to facilitate coupling with resonator 12 and to enable both oscillators 18 and 24 to receive the reference signal generated by the resonator. Each oscillator interface characteristically comprises a parasitic impedence, as shown by parasitic impedances 14 and 16.

First oscillator 18 comprises an amplifier 22 for amplifying an input corresponding with the reference signal provided by resonator 12. Additionally, oscillator 18 comprises a first feedback circuit 20 for generating a first oscillating signal in response to the output of amplifier 22. To that end, first feedback circuit 20 is coupled with amplifier 22 and preferably comprises a pair of capacitors. Moreover, amplifier 22 is coupled with a biasing circuit 30.

Similarly, second oscillator 24 comprises an amplifier 28 for amplifying an input corresponding with the reference signal provided by resonator 12. Second oscillator 24 also comprises a second feedback circuit 26 which is also preferably realized by two capacitors. Feedback circuit 26 is coupled with amplifier 28 for generating a second oscillating signal in response to output of amplifier 28. Amplifier 28 is also coupled with biasing circuit 30.

To provide a balanced design, the outputs of both oscillators 18 and 24 are 180 degrees out of phase with one another, yet equal in magnitude. It should be noted that while both oscillators 18 and 24 preferably comprise identical functional components, alternate oscillator designs which achieve the advantages of the present invention may be apparent to one of ordinary skill in the art.

System 10 moreover comprises an antenna which in turn preferably comprises parasitic impedances 14 and 16. These parasitic elements 14 and 16 functionally operate to radiate the balanced oscillator output signal. By utilizing this system design, the signal level of the balanced oscillator output signal radiated by the antenna is substantially lower power than other oscillator designs employing inductors or the like to radiate energy because of the reduced loop area required for the current flow and the limiting inductive effect of the parasitic impedance. Furthermore, with respect to the fundamental and harmonic components of the output signal, the proportionality of the reduction of the signal power is relatively equal. Thus, the signal to noise ratio of the resultant balanced oscillator output signal is substantially enhanced. It should be apparent that this embodiment is ideal for particular environments where a lower power, high signal to noise ratio output signal is required, though applications may be apparent to one of ordinary skill.

Figure 2:
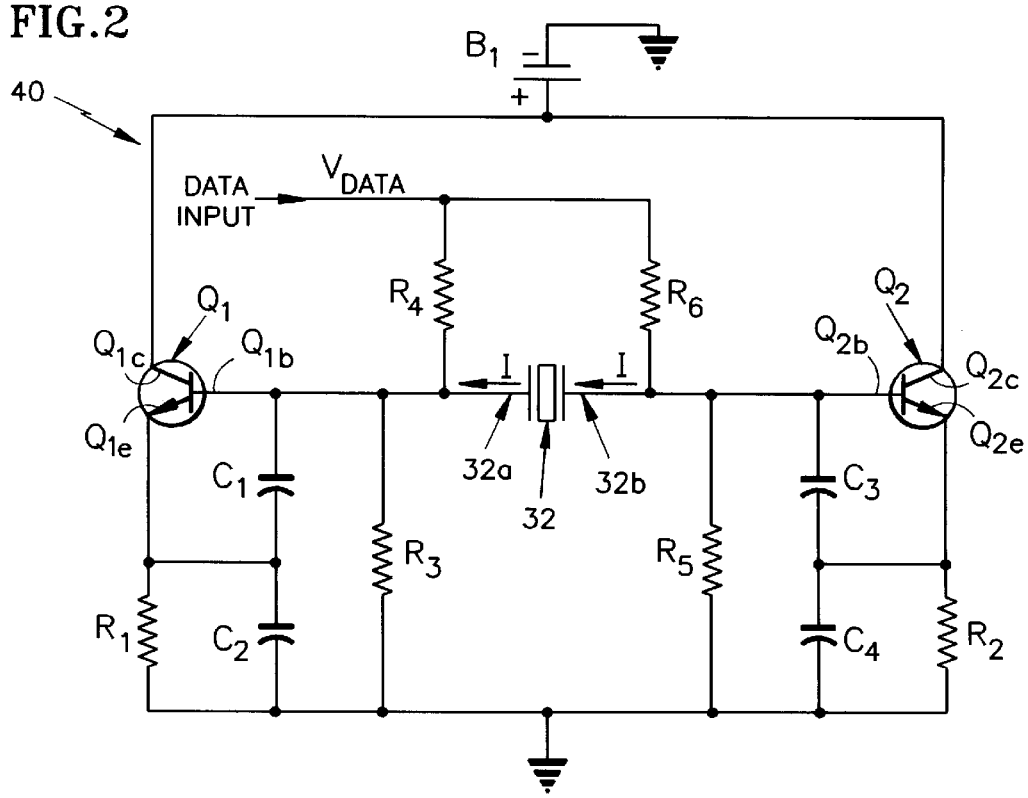
FIG. 2 illustrates a preferred circuit realization of the preferred embodiment of the present invention.

Referring to FIG. 2, a preferred circuit realization 40 of the preferred embodiment of the present invention is depicted. Circuit 40 comprises a first and second oscillator. Both oscillators are balanced with respect to one another and share an oscillating current signal I. Circuit 40 described herein is particularly applicable with automotive remote keyless entry systems. Other applications, however, are clearly conceivable to one of ordinary skill in the art.

According to a more detailed description, circuit 40 comprises a balanced oscillator configuration having two independent oscillator circuits for producing a local oscillation signal. The first and second oscillator circuits each comprise a first and second transistor, $Q_1$ and $Q_2$, respectively, and are both coupled with a first resonator device 32 positioned therebetween. Resonator device 32 acts as a series resonant input tank for generating and stabilizing the oscillating current signal I. By so doing, a resonance RF carrier frequency is achieved.

First and second transistors, $Q_1$ and $Q_2$, are each preferably realized by a bipolar junction transistor ("BJT"). Alternatives, however, such as a heterojunction bipolar transistor ("HBT") or a field effect transistor ("FET"), should be apparent to one of ordinary skill in the art. According to a further embodiment, transistors $Q_1$ and $Q_2$ are each MMBTH10 type bipolar transistors.

Transistors $Q_1$ and $Q_2$ each operate as an amplification stage to provide a unity loop gain for steady state operations. First transistor $Q_1$ comprises a base, a collector, and emitter, $Q_{1b}$, $Q_{1c}$, and $Q_{1e}$, respectively. Likewise, second transistor $Q_2$ comprises a base, a collector, and emitter, $Q_{2b}$, $Q_{2c}$, and $Q_{2e}$, respectively. Transistors $Q_1$ and $Q_2$ each have resistors, $R_1$ and $R_2$, respectively, which are coupled between $Q_{1e}$ and $Q_{2e}$, respectively, and a ground node. Moreover, transistors $Q_1$ and $Q_2$ are each configured as a tuned circuit having positive feedback. It should be understood by one of ordinary skill in the art that various other transistor oscillator configurations may be substituted into the above arrangement to achieve the same functional purpose.

Resonator device 32 is coupled between a pair of nodes each comprising the base terminals $Q_{1b}$ and $Q_{2b}$ of transistors $Q_1$ and $Q_2$, respectively, via resonator output lines 32a and 32b. By this design, each of the output lines, 32a and 32b, of resonator 32 are coupled with a respective amplifier stage. Thus, first output line 32a is coupled with transistors $Q_1$, while second output line 32b is coupled with transistors $Q_2$ to enable the reference signal created by resonator 32 to be amplified. To provide a balanced design, as desired in the preferred embodiment, the outputs of both oscillators are 180 degrees out of phase with one another, yet equal in magnitude.

Resonator 32 may comprise an array of metallic fingers formed on a piezoelectric substrate. Resonator 32 advantageously operates to stabilize oscillations of the carrier signal. Resonator 32 preferably comprises a surface acoustic wave ("SAW") device. However, according to a further embodiment, resonator 32 is a RO2073 SAW resonator manufactured and sold by RF Monolithics, Incorporated. Yet in still another embodiment, resonator 32 comprises a bulk acoustic wave ("BAW") device.

Each oscillator of circuit 40 further comprises a feedback circuit. Each feedback circuit comprises a resonating circuit section which in turn preferably comprises a capacitor pairing and one half of resonator 32. The first capacitor pairing, $C_1$ and $C_2$, are employed to functionally generate a first oscillating output signal in response to the reference signal amplified by the transistor $Q_1$. Here, capacitor $C_1$ is coupled at the node comprising $Q_{1b}$ and first output line 32*a*, while capacitor $C_2$ is coupled to a node comprising a second end of capacitor $C_1$, and the node coupling $Q_{1e}$ with resistor $R_1$. Similarly, the second capacitor pairing, $C_3$ and $C_4$, and one half of resonator 32 generate a second oscillating output signal in response to the reference signal amplified by the transistor $Q_2$. Capacitor $C_3$ is coupled at the node comprising $Q_{2b}$ and second output line 32*b*, while capacitor $C_4$ is coupled to a node comprising a second end of capacitor $C_3$, and the node coupling $Q_{2e}$ with resistor $R_2$. Capacitor pairings $C_1$ and $C_2$, as well as $C_3$ and $C_4$ are also incorporated so as to establish a voltage divider network for each respective oscillator.

Furthermore, circuit 40 also comprises a DC bias voltage input source $B_1$, typically 3V, along with an impedance network which are coupled with both first and second oscillators. With respect to the first oscillator circuit, the positive lead of input source $B_1$ is coupled to $Q_{1c}$. Likewise, the positive lead of input source $B_1$ is also coupled to a node which includes $Q_{2c}$ in the second oscillator circuit. The negative lead, it should be noted, of input source $B_1$ is coupled to ground.

Both first and second oscillator circuits receive a data input signal, $V_{DATA}$, for encoding an RF carrier signal, by means of a resistor network which forms a divider circuit. The data input signal, $V_{DATA}$, encodes a carrier signal with a modulation scheme to provide information on the carrier signal. The preferred modulation format is amplitude modulation ("AM"), though pulse width modulation or frequency shift key modulation, and others may be easily substituted by one of ordinary skill in the art. The information provided on the carrier signal may control and/or initiate various system operations, such as a door lock actuation mechanism, as well as the on/off operations of circuit 40. Application of data input signal $V_{DATA}$ may be initiated by manual control through an actuation mechanism such as, for example, a push-button pad, switch or other pulsed activation device.

Data input signal, $V_{DATA}$, feeds directly to a node comprising a first end of resistors $R_4$ and $R_6$. The second end of resistor $R_4$ is coupled to a node including interface 32*a* of resonator 32, $Q_{1b}$, first capacitor $C_1$, and a resistor $R_3$. The second end of resistor $R_6$, likewise, is coupled to a node which includes interface 32*b* of resonator 32, $Q_{2b}$, capacitor $C_3$, and a resistor $R_5$. Resistors $R_3$ and $R_4$, as well as $R_5$ and $R_6$ are incorporated so as to establish a divider network for each respective oscillator. The second ends of the resistors $R_3$ and $R_5$ are coupled to a ground node along with the negative lead of input source $B_1$. Resistor $R_3$ is further coupled with second capacitor $C_2$, while resistor $R_5$ is further coupled with second capacitor $C_4$.

Circuit 40 additionally comprises an antenna for radiating the output signal corresponding with the first and second oscillating output signals in response to the commonly shared oscillating current signal I. The antenna is preferably realized by the parasitic impedances created by interfaces, 32*a* and 32*b*, of resonator 32. Interfaces, 32*a* and 32*b* comprise a lead, wire, trace, socket or connector. Parasitic impedances 32*a* and 32*b* each operate as an antenna for transmitting and radiating an electromagnetic field exhibiting the oscillating signal with the predetermined carrier frequency. Energy is efficiently stored in capacitors $C_1$, $C_2$, $C_3$ and $C_4$ to enhance radiation efficacy by reducing the amount of energy that may otherwise be required for each cycle of transistors $Q_1$ and $Q_2$.

It should be noted that by incorporating the above circuit design several benefits are derived. By employing this configuration utilizing parasitic impedances 32*a* and 32*b* as the antenna, the packaging of the resultant circuit 40 is substantially reduced. This is in part because a specifically realized antenna, such as an inductor, is not required to facilitate transmission. As such, the current flow between both oscillators requires a reduced path which thereby provides the basis for an electromagnetic radiation having reduced field strength. By utilizing this design, therefore, the signal level of the balanced oscillator output signal radiated by the antenna is substantially low power because of the reduced loop area required for the current flow and the limiting inductive effect of the parasitic impedance. Furthermore, with respect to the fundamental and harmonic components of the output signal, the proportionality of the reduction of the signal power is relatively equal. Thus, the signal to noise ratio of the resultant balanced oscillator output signal is substantially enhanced. It should be apparent that this embodiment is ideal for particular environments where a lower power, high signal to noise ratio output signal is required, though applications may be apparent to one of ordinary skill.

Figure 3:
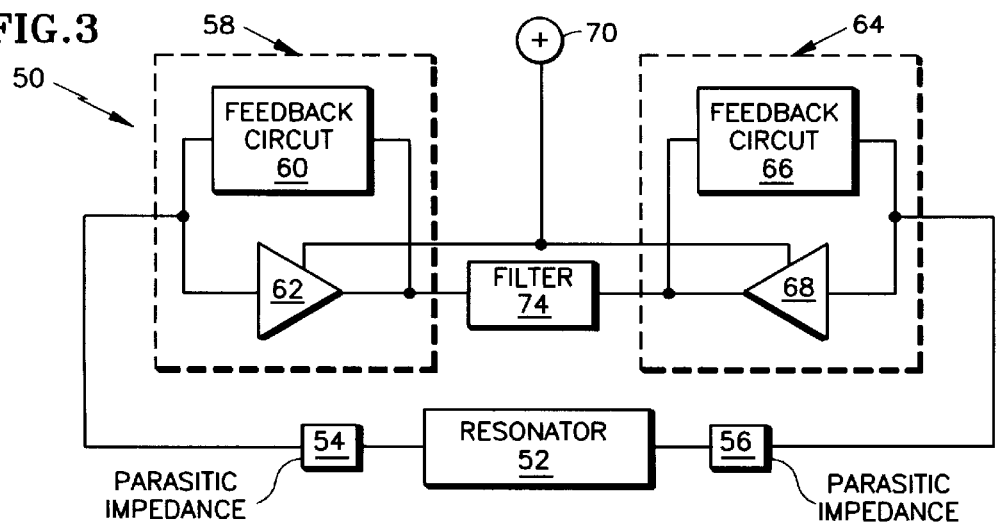
FIG. 3 illustrates a block diagram of a balanced oscillator and transmitter system according to a further embodiment of the present invention.

Referring to FIG. 3, a block diagram of a balanced oscillator and transmitter system 50 according to a further embodiment of the present invention. System 50 comprises a balanced oscillator having a resonator 52 for generating a reference signal. Preferably, resonator 52 comprises a surface acoustic wave ("SAW") device. However, in an alternate embodiment, resonator 52 is realized by a bulk acoustic wave ("BAW") device.

Further, the balanced oscillator comprises a first and a second oscillator, 58 and 64, each of which are coupled to resonator 52 by means of an interface. This interface comprises a lead, wire, trace, socket or connector to facilitate coupling with resonator 52 and to enable both oscillators 58 and 64 to receive the reference signal generated by the resonator. Each oscillator interface characteristically comprises a parasitic impedence, as shown by parasitic impedances 54 and 56.

First oscillator 58 comprises an amplifier 62 for amplifying an input corresponding with the reference signal provided by resonator 52. Additionally, oscillator 58 comprises a first feedback circuit 60 for generating a first oscillating signal in response to the output of amplifier 62. To this end, first feedback circuit 60 is coupled with amplifier 62 and preferably comprises two capacitors. Moreover, amplifier 62 is coupled with a biasing circuit 70.

Similarly, second oscillator 64 comprises an amplifier 68 for amplifying an input corresponding with the reference signal provided by resonator 52. Second oscillator 64 also comprises a second feedback circuit 66 which is coupled with amplifier 68. Second feedback circuit 66 generates a second oscillating signal in response to the output of amplifier 68 and preferably comprises two capacitors. Amplifier 62 is also coupled with biasing circuit 70. It should be noted that while both oscillators 58 and 64 preferably comprise identical functional components, alternate oscillator designs which achieve the advantages of the present invention may be apparent to one of ordinary skill in the art.

To provide a balanced design, the outputs of both oscillators 58 and 64 are 180 degrees out of phase with one another, yet equal in magnitude. This feature is further facilitated by the inclusion of a filter 74. Filter 74 provides phase shifting of the output signal transmitted by the antenna and is coupled between first oscillator 58 and second oscillator 64.

System 50 moreover comprises an antenna composed of several elements. First, the antenna comprises parasitic impedances 54 and 56. The antenna is further realized by filter 74 comprising impedance which includes any of the following: a fixed inductor, a fixed capacitor, and/or a trace parasitic. Parasitic elements 54 and 56 in conjunction with filter 74 functionally operate to radiate the balanced oscillator output signal.

By utilizing this system design, the signal level of the balanced oscillator output signal radiated by antenna is substantially higher power, relative to the preferred embodiment of FIGS. 1 and 2, than other oscillator designs employing inductors or the like to radiate energy because of the reduced loop area required for the current flow and the limiting inductive effect of the parasitic impedance. This distinction over the preferred embodiment is attributable to incorporation of filter 74. Furthermore, with respect to the fundamental and harmonic components of the output signal, the proportionality of the reduction of the signal power is relatively equal. Thus, the signal to noise ratio of the resultant balanced oscillator output signal is substantially enhanced. It should be apparent that this embodiment is ideal for particular environments where a higher power, high signal to noise ratio output signal is required, though applications may be apparent to one of ordinary skill.

Figure 4:
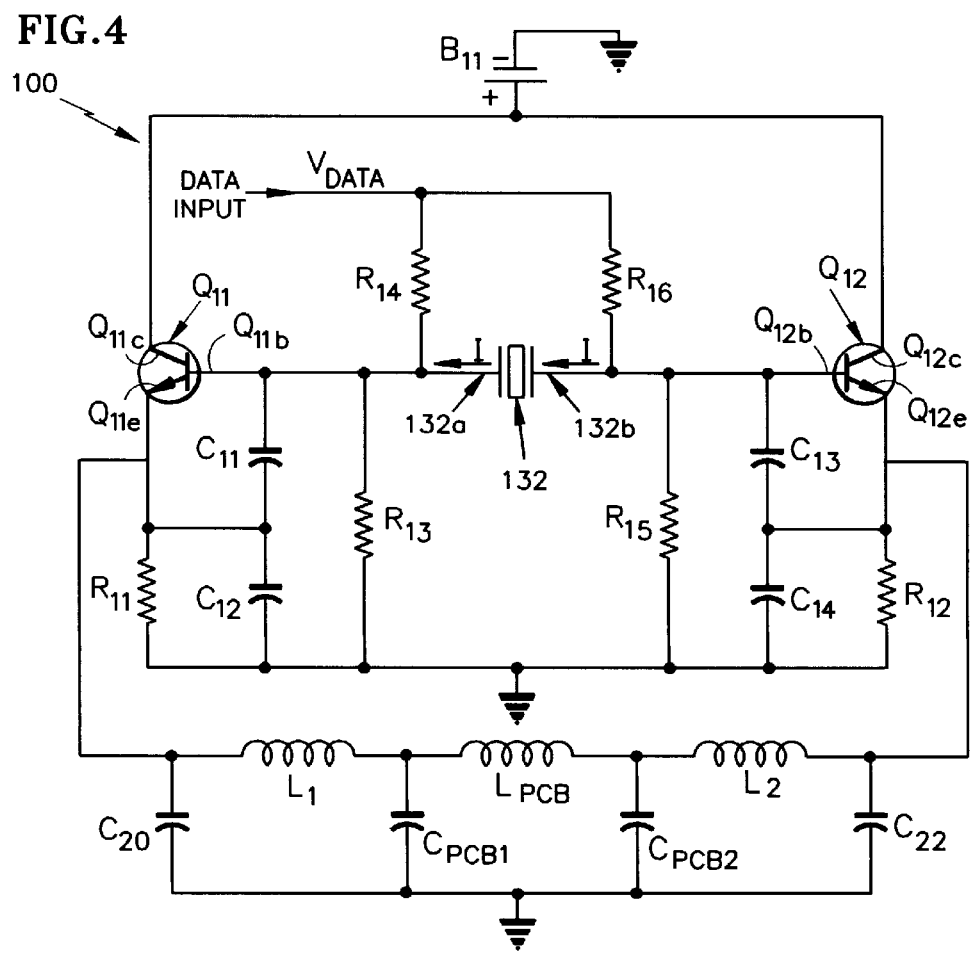
FIG. 4 illustrates a circuit realization of the embodiment of FIG. 3.

Referring to FIG. 4, a circuit realization 100 of the embodiment of FIG. 3. Circuit 100 comprises a first and second oscillator. Both oscillators are balanced with respect to one another and share an oscillating current signal I. Circuit 100 described herein is particularly applicable with automotive remote keyless entry systems. Other applications, however, are clearly conceivable to one of ordinary skill in the art.

According to a more detailed description, circuit 100 comprises a balanced oscillator configuration having two independent oscillator circuits for producing a local oscillation signal. The first and second oscillator circuits each comprise a first and second transistor, $Q_{11}$ and $Q_{12}$, respectively, and are both coupled with a first resonator device 132 positioned therebetween. Resonator device 132 acts as a series resonant input tank for generating and stabilizing the oscillating current signal I. By so doing, a resonance RF carrier frequency is achieved.

First and second transistors, $Q_{11}$ and $Q_{12}$, are realized by a bipolar junction transistor ("BJT"). Alternatives, however, such as a heterojunction bipolar transistor ("HBT") or a field effect transistor ("FET"), should be apparent to one of ordinary skill in the art. According to a further embodiment, transistors $Q_{11}$ and $Q_{12}$ are each MMBTH10 type bipolar transistors.

Transistors $Q_{11}$ and $Q_{12}$ each operate as an amplification stage to provide a unity loop gain for steady state operations. First transistor $Q_{11}$ comprises a base, a collector, and emitter, $Q_{11b}$, $Q_{11c}$, and $Q_{11e}$, respectively. Likewise, second transistor $Q_{12}$ comprises a base, a collector, and emitter $Q_{12b}$, $Q_{12c}$, and $Q_{12e}$, respectively. Transistors $Q_{11}$ and $Q_{12}$ each have resistors, $R_{11}$ and $R_{12}$, respectively, which are coupled between $Q_{11e}$ and $Q_{12e}$, respectively, and a ground node. Moreover, transistors $Q_{11}$ and $Q_{12}$ are each configured within a circuit having feedback. It should be understood by one of ordinary skill in the art that various other transistor oscillator configurations may be substituted into the above arrangement to achieve the same functional purpose.

Resonator device 132 is coupled between a pair of nodes each comprising the base terminals $Q_{11b}$ and $Q_{12b}$ of transistors $Q_{11}$ and $Q_{12}$, respectively, via resonator output lines 132a and 132b. By this design, each of the output lines, 132a and 132b, of resonator 132 are coupled with a respective amplifier stage. Thus, first output line 132a is coupled with transistor $Q_{11}$, while second output line 132b is coupled with transistor $Q_{12}$ to enable the reference signal created by resonator 132 to be amplified. To provide a balanced design, as desired in the preferred embodiment, the outputs of both oscillators are 180 degrees out of phase with one another, yet equal in magnitude.

Resonator 132 may comprise an array of metallic fingers formed on a piezoelectric substrate. Resonator 132 advantageously operates to stabilize oscillations of the carrier signal. Resonator 132 preferably comprises a surface acoustic wave ("SAW") device. However, according to a further embodiment, resonator 132 is a RO2073 SAW resonator manufactured and sold by RF Monolithics, Incorporated. Yet in still another embodiment, resonator 132 comprises a bulk acoustic wave ("BAW") device.

Each oscillator of circuit 100 further comprises a resonating tank circuit. Each resonating tank circuit preferably comprises a capacitor pairing and one half of the resonator 132. The first resonating tank circuit capacitor pair, $C_{11}$ and $C_{12}$, are employed to functionally generate a first oscillating output signal in response to the reference signal amplified by the transistor $Q_{11}$. Here, capacitor $C_{11}$ is coupled at the node comprising $Q_{11b}$ and first output line 132a, while capacitor $C_{12}$ is coupled to a node comprising a second end of capacitor $C_{11}$, and the node coupling $Q_{11e}$ with resistor $R_{11}$. Similarly, second resonating tank circuit capacitor pair, $C_{13}$ and $C_{14}$, and one half the resonator 132 generate a second oscillating output signal in response to the reference signal amplified by the transistor $Q_{12}$. Capacitor $C_{13}$ is coupled at the node comprising $Q_{12b}$ and second output line 132b, while capacitor $C_{14}$ is coupled to a node comprising a second end of capacitor $C_{13}$, and the node coupling $Q_{12e}$ with resistor $R_{12}$. Capacitor pairings $C_{11}$ and $C_{12}$, as well as $C_{13}$ and $C_{14}$ are also incorporated so as to establish a divider network for each respective oscillator.

Furthermore, circuit 100 also comprises a DC bias voltage input source $B_{11}$, typically 3V, along with an impedance network which are coupled with both first and second oscillators. With respect to the first oscillator circuit, the positive lead of voltage input source $B_{11}$ is coupled to $Q_{11c}$. Likewise, the positive lead of voltage input source $B_{11}$ is also coupled to a node which includes $Q_{12c}$ in the second oscillator circuit. The negative lead, it should be noted, of voltage input source $B_{11}$ is coupled to ground.

Both first and second oscillator circuits receive a data input signal, $V_{DATA}$, for encoding an RF carrier signal, by means of a resistor network which forms a voltage divider circuit. The data input signal, $V_{DATA}$, encodes a carrier signal with a modulation scheme to provide information on the carrier signal. The preferred modulation format is amplitude modulation ("AM"), though pulse width modulation or frequency shift key modulation, and others may be easily substituted by one of ordinary skill in the art. The information provided on the carrier signal may control and/or initiate various system operations, such as a door lock actuation mechanism, as well as the on/off operations of circuit 100. Application of data input signal $V_{DATA}$ may be initiated by manual control through an actuation mechanism such as, for example, a push-button pad, switch or other pulsed activation device.

Data input signal, $V_{DATA}$, feeds directly to a node comprising a first end of resistors $R_{14}$ and $R_{16}$. The second end of resistor $R_{14}$ is coupled to a node including interface 132a of resonator 132, $Q_{11b}$, first capacitor $C_{11}$, and a resistor $R_{13}$. The second end of resistor $R_{16}$, likewise, is coupled to a node which includes interface 132b of resonator 132, $Q_{12b}$, capacitor $C_{13}$, and a resistor $R_{15}$. Resistors $R_{13}$ and $R_{14}$, as well as $R_{15}$ and $R_{16}$ are incorporated so as to establish a voltage divider network for each respective oscillator. The second ends of the resistors $R_{13}$ and $R_{15}$ are coupled to a ground node along with the negative lead of voltage input source $B_{11}$. Resistor $R_{13}$ is further coupled with second capacitor $C_{12}$, while resistor $R_{15}$ is further coupled with second capacitor $C_{14}$. It should be noted that in the preferred embodiment, the data input section is designed to receive amplitude modulation ("AM") data, while in an alternate embodiment, the data input section is preferably designed to receive frequency shift key ("FSK") modulation data.

Furthermore, circuit 100 additionally comprises a filter for phase shifting the circuit's resultant output signal. As such, the filter is coupled between $Q_{11e}$ and $Q_{12e}$ of transistors $Q_{11}$ and $Q_{12}$, respectively. It should be noted that the following elements ideally are mounted on a printed circuit board ("PCB") to realize certain benefits, including specific trace parasitics characteristics.

The filter, as illustrated in FIG. 4, comprises a first and second fixed capacitor, $C_{20}$ and $C_{22}$, which are directly coupled to $Q_{11e}$ and $Q_{12e}$, respectively, on one end, and to ground on the other end. Also coupled to the node coupling $Q_{11e}$, and capacitor $C_{20}$, as well as other elements, is a first fixed inductor $L_1$. The other end of first inductor $L_1$ is coupled to a first capacitance, $C_{PCB1}$, as well as a first conductive trace parasitic inductance, $L_{PCB}$. The further end of first capacitance, $C_{PCB1}$, is then coupled to ground. Moreover, the other end of first trace parasitic inductance, $L_{PCB}$, is coupled to a second capacitance, $C_{PCB2}$, which like first capacitance, $C_{PCB1}$, is also coupled to ground. Coupled between the non-ground ends of both second capacitance $CPCB_2$ and fixed capacitor $C_{22}$ is a second inductor, $L_2$. The node wherein fixed capacitor $C_{22}$ and second second inductor $L_2$ adjoin is further coupled with $Q_{12e}$ of transistor $Q_{12}$. It should be noted that first and second capacitances, $C_{PCB1}$ and $C_{PCB2}$, are preferably realized by capacitors. However, alternately, first and second capacitances, $C_{PCB1}$ and $CPCB_2$, preferably may be conductive traces that created parasitic capacitances.

Circuit 100 additionally comprises an antenna for radiating the output signal corresponding with the first and second oscillating output signals in response to the commonly shared oscillating current signal I. The antenna is realized by the parasitic impedances created by interfaces, 132a and 132b, of resonator 132, as well as the filter elements, including first and second fixed capacitors, $C_{20}$ and $C_{22}$, first and second fixed inductors, $L_1$ and $L_2$, first and second trace parasitic capacitances, $C_{PCB1}$ and $C_{PCB2}$, and first trace parasitic inductance, $L_{PCB}$. As detailed herein, Interfaces, 132a and 132b comprise a lead, wire, trace, socket or connector. Parasitic impedances 132a and 132b, and the filter components—first and second fixed capacitor, $C_{20}$ and $C_{22}$, first and second fixed inductors, $L_1$ and $L_2$, first and second trace parasitic capacitances, $C_{PCB1}$ and $C_{PCB2}$, and first trace parasitic inductance, $L_{PCB}$—each operate as an antenna for transmitting and radiating an electromagnetic field exhibiting the oscillating signal with the predetermined carrier frequency. Energy is efficiently stored in capacitors $C_{11}$, $C_{12}$, $C_{13}$ and $C_{14}$ to enhance radiation efficacy by reducing the amount of energy that may otherwise be required for each cycle of transistors $Q_{11}$ and $Q_{12}$.

It should be noted that by incorporating the above circuit design several benefits are derived. By employing this configuration utilizing parasitic impedances 132a and 132b and the filter components—first and second fixed capacitor, $C_{20}$ and $C_{22}$, first and second fixed inductors, $L_1$ and $L_2$, first and second trace parasitic capacitances, $C_{PCB1}$ and $C_{PCB2}$, and first trace parasitic inductance, $L_{PCB}$—as the antenna, the signal level of the balanced oscillator output signal radiated by the antenna is substantially higher power than the preferrred embodiment because of the increased loop area required for the current flow and the limiting inductive effect of the parasitic impedance in conjunciton with the filter elements. Furthermore, with respect to the fundamental and harmonic components of the output signal, the proportionality of the reduction of the signal power is relatively equal. Thus, the signal to noise ratio of the resultant balanced oscillator output signal is substantially enhanced. It should be apparent that this embodiment is ideal for particular environments where a higher power, high signal to noise ratio output signal is required, though applications may be apparent to one of ordinary skill.

Figure 5:
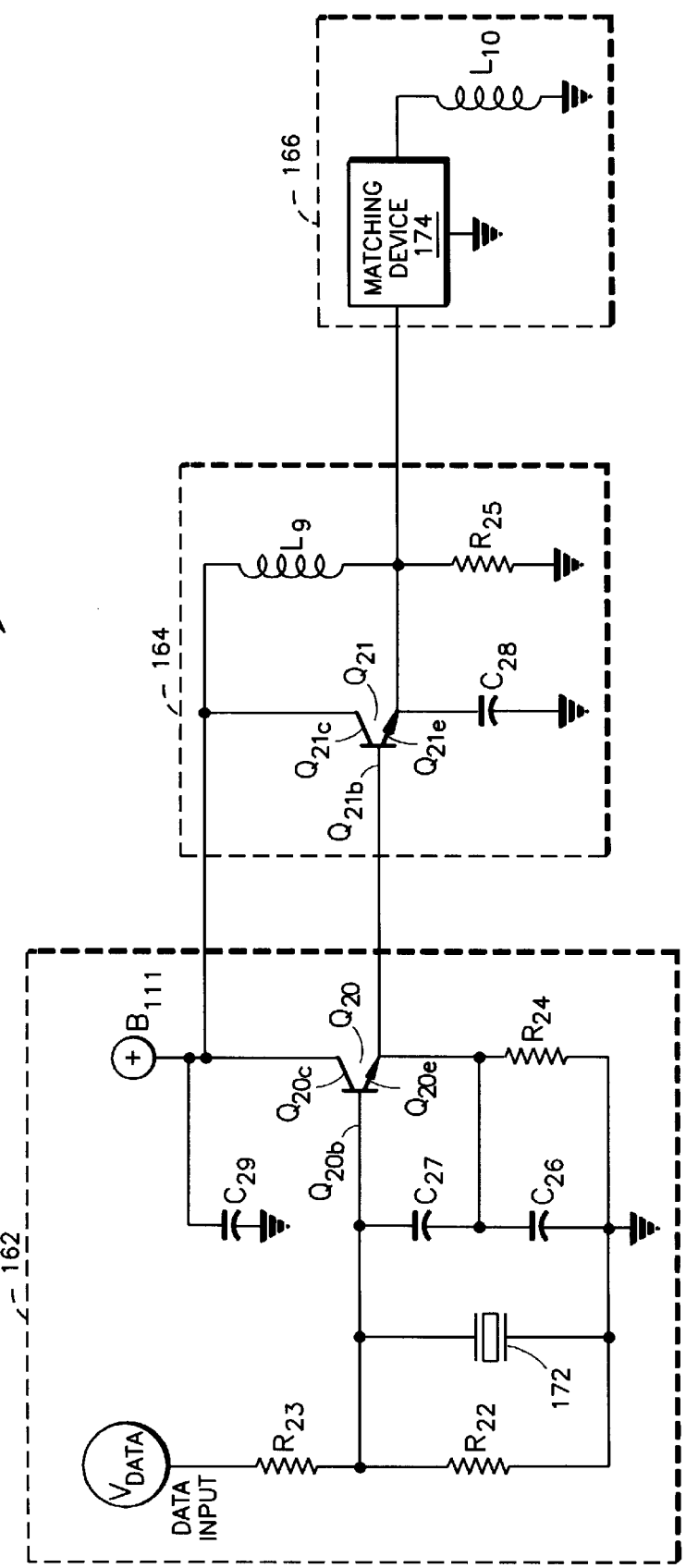
FIG. 5 illustrates a further alternate embodiment of the present invention.

Referring to FIG. 5, a further alternate embodiment is illustrated depicting a buffered oscillator and transmitter circuit 160. Circuit 160 comprises three functional stages: an oscillator 162, a buffer 164 and an output system 166. Circuit 160 described herein is particularly applicable with automotive remote keyless entry systems. Other applications, however, are clearly foreseeable to one of ordinary skill in the art.

According to a more detailed description, oscillator 162 comprises a transistor $Q_{20}$ configuration and an input resonant tank circuit. The tank circuit comprises a resonator 172, such as a surface acoustic wave ("SAW") device, a pair of feedback capacitors, $C_{26}$ and $C_{27}$, as well as a capacitor $C_{29}$ for providing a large capacitance to maintain a constant DC voltage. Further, the oscillator also includes a number of biasing resistors to facilitate the proper operation of transistor $Q_{20}$. Transistor $Q_{20}$ functionally provides a unity loop gain for steady state operations.

Structurally, transistor $Q_{20}$ comprises a base, $Q_{20b}$, collector, $Q_{20c}$, and an emitter $Q_{20e}$. $Q_{20b}$ is coupled with a node comprising surface acoustic wave resonator 172 and feedback capacitor $C_{27}$, and collector $Q_{20c}$ is coupled with a DC bias voltage input source $B_{111}$, while $Q_{20e}$ is coupled to ground through a first end of resistor $R_{24}$. Additionally, feedback capacitor $C_{27}$ is coupled to another node comprising $Q_{20e}$, the first end of resistor $R_{24}$, and feedback capacitor $C_{26}$. Feedback capacitor $C_{26}$, moreover, is coupled in parallel with resistor $R_{24}$. The second ends of capacitor $C_{26}$ and resistor $R_{24}$ are both coupled to ground. Capacitor $C_{29}$ is coupled between ground and DC bias voltage input source $B_{111}$.

Collector $Q_{20c}$ is coupled to the voltage input source $B_{111}$ to receive a DC bias input $B_{111}$, typically 3V. Oscillator 162 also receives a data input signal $V_{DATA}$ for encoding the RF carrier signal, by means of a resistor network forming a voltage divider circuit. Data input, $V_{DATA}$, encodes the carrier signal with a modulation scheme to provide information on the carrier signal. The preferred modulation format is amplitude modulation ("AM"), though pulse width modulation for example, and others may be easily substituted by one of ordinary skill in the art. The information provided on the carrier signal may control and/or initiate various system operations, such as a door lock actuation mechanism, as well as the on/off operations of circuit 160. Application of data input sign $V_{DATA}$ may be initiated by manual control through an actuation mechanism such as, for example, a push-button pad, switch or other pulsed activation device. By this configuration, transistor $Q_{20}$, acting as an amplifier, in combination with the resonating tank circuit, generates a oscillating output signal.

Transistors, $Q_{20}$ and $Q_{21}$, each preferably comprise a bipolar junction transistor ("BJT"). Alternatives, however, such as a heterojunction bipolar transistor ("HBT"), should be apparent to one of ordinary skill in the art. According to a further embodiment, transistors $Q_{20}$ and $Q_{21}$ are each MMBTH10 type bipolar transistors.

Resonator device 172 is coupled between base $Q_{20b}$ of transistor $Q_{20}$ and ground. Resonator 172 advantageously operates to stabilize oscillations of the carrier signal. Resonator device 172 preferably comprises a series resonant input tank circuit surface acoustic wave ("SAW") device. However, according to a further embodiment, SAW resonator 172 is a RO2073 SAW resonator manufactured and sold by RF Monolithics, Incorporated.

Buffer 164 functionally minimizes the effects of parasitic impedances created by a user's hand when grasping an RKE fob, by the filler plastics created by the RKE's housing, as well as the headliner or other interior materials in the event the fob is fixably mounted within the interior of an automobile. To realize this benefit, buffer 164 comprises a transistor $Q_{21}$, as well as a buffer resonant tank of inductor $L_9$ and capacitor $C_{28}$. Transistor $Q_{21}$ comprises a base, $Q_{21b}$, an emitter, $Q_{20e}$, and a collector, $Q_{20c}$. Buffer 164 is coupled with oscillator 162 at two nodes. First, buffer 164 receives a DC bias input from $B_{111}$ at $Q_{20c}$, wherefrom oscillator 162 is also biased. Buffer 164 is also coupled with oscillator 162 along $Q_{20e}$ of transistor $Q_{20}$ and base of transistor $Q_{21}$.

Output stage 166 is coupled with buffer 164 for the purpose of transmitting the oscillating signal. The output of buffer 164, having an oscillating output at the resonant frequency, is transmitted across to stage 166. Stage 166 additionally comprises a matching device 174 for matching the output impedance of the circuit. Finally, output stage 166 comprises an antenna in the form of inductor $L_{10}$ for transmitting the resultant oscillating signal.

It should be noted that the oscillator and transmitter circuits of the present invention may be mounted within a compact enclosure and advantageously employed to transmit control signals, especially for use in connection with a remote controlled keyless entry system. For such an application, the user may manually activate the $V_{DATA}$ input to encode the carrier signal with selected information. The carrier signal and modulating information are then radiated from the transmitter circuits by means of the output tanks. A receiver which is generally mounted within a vehicle will receive the radiating signal, decode the modulating information and initiate and/or execute the selected operation such as locking or unlocking a vehicle door, activating or deactivating an alarm system, for example. In contrast to conventional approaches, these circuits advantageously achieve increased output power and maintain an efficient power usage therewith.

Furthermore, it should also be apparent that the embodiments of the present invention may use various sized components which may be modified without departing from the invention. As one example, inductor $L_9$ provides an inductance of approximately 40 nH. Capacitors $C_{27}$ and $C_{28}$ each may have a capacitance of approximately 4.7 pF, while capacitor $C_{26}$ has a capacitance of about 22 pF. Resistor $R_{23}$ may have a resistance of about 15 kΩ. Resistor $R_{22}$ may have a resistance of about 6.8 kΩ, while resistor $R_{24}$ has a resistance of about 180 kΩ.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. Thus, for example, it should be apparent to one of ordinary skill in the art that while the transmitter herein has been detailed as operating in the RF frequency range, other formats are available which would take full advantage of the present invention. Similarly, while bipolar junction transistors are described herein as one potential realization of an amplifier, other designs are available which utilize other transistor types, such as field effect transistors ("FETs"), JFETs and MOSFETs, for example, known to one of ordinary skill in the art. Moreover, the antenna of the present invention may also be realized by a patch antenna design, as would be apparent to one of ordinary skill in the art in view of the present invention. It is therefore contemplated that the appended claims will cover any such modifications or embodiments as fall within the true scope of the invention.

What is claimed is:

1. A transmitter circuit for transmitting an output signal having a singular frequency, said transmitter circuit having an output impedance and comprising:

a buffered oscillator comprising:
a resonator for generating a reference signal;
an amplifier coupled with said resonator for amplifying said reference signal;
a first resonant tank for generating an oscillating output signal in response to said amplified reference signal; and
a buffer circuit for buffering said oscillating output signal such that the effects of a parasitic impedance are minimized; and
said buffer circuit decreasing the output impedance;
an antenna for radiating the output signal corresponding with said buffered oscillating output signal.

2. The invention of claim 1, wherein said resonator comprises a surface acoustic wave ("SAW") device.

3. The invention of claim 1, wherein said first resonant tank comprises a capacitor and an inductor.

4. The invention of claim 1, further comprising a positive feedback path coupled with said amplifier.

5. The invention of claim 1, wherein said antenna comprises an inductor for radiating the output signal.

6. The invention of claim 1, further comprising:

a filter for removing noise from said oscillating output signal; and
a matching circuit for matching the output impedance of the transmitter circuit to an impedance of the antenna.

7. The invention of claim 1, further comprising a device for increasing a transmission output range of said output signal.

8. The invention of claim 7, wherein said device comprises a first impedance, said first impedance coupled with a second impedance to form a voltage divider circuit.

9. The invention of claim 1, wherein said buffer circuit comprises:

a buffer amplifier; and a supplemental resonant tank for decreasing the output impedance.

10. The invention of claim 9, wherein at least one of said amplifier and said buffer amplifier comprises a bipolar junction transistor.

11. The invention of claim 1, wherein said buffer circuit is a common collector buffer circuit.

12. The invention of claim 11, wherein said amplifier is a common collector amplifier.

13. A transmitter circuit for transmitting an output signal having a singular frequency, said transmitter circuit having an output impedance and comprising:

a buffered oscillator comprising:

a resonator for generating a reference signal;

a common collector amplifier coupled with said resonator for amplifying said reference signal;

a first resonant tank for generating an oscillating output signal in response to said amplified reference signal; and a common collector buffer circuit for buffering said oscillating output signal such that the effects of a parasitic impedance are minimized, said buffer circuit including a buffer amplifier and a supplemental resonant tank for decreasing the output impedance; and an antenna for radiating the output signal corresponding with said buffered oscillating output signal.

14. The invention of claim 13, further comprising:

a filter for removing noise from said buffered oscillating output signal; and a matching circuit for matching the output impedance of the transmitter circuit to an impedance of the antenna.

* * * * *